United States Patent [19]

Okumura et al.

[11] Patent Number: 5,558,722

[45] Date of Patent: Sep. 24, 1996

[54] PLASMA PROCESSING APPARATUS

[75] Inventors: Tomohiro Okumura, Neyagawa; Ichiro Nakayama, Kadoma; Yoshihiro Yanagi, Neyagawa, all of Japan

[73] Assignee: Matsushita Electric Industrial Co., Ltd., Osaka-fu, Japan

[21] Appl. No.: 528,164

[22] Filed: Sep. 14, 1995

[30] Foreign Application Priority Data

Sep. 14, 1994 [JP] Japan .................................. 6-219323

[51] Int. Cl.⁶ .................................................. C23C 16/00
[52] U.S. Cl. .................................. 118/723 I; 118/723 IR; 118/723 E; 156/345
[58] Field of Search .......................... 156/345; 118/723 I, 118/723 IR, 723 E, 723 MP; 313/231.31, 231.41; 315/111.21

[56] References Cited

U.S. PATENT DOCUMENTS

| | | | |
|---|---|---|---|
| 3,705,091 | 10/1971 | Adir | 118/723 I |
| 4,329,418 | 5/1982 | Kny et al. | 430/270 |
| 5,091,049 | 2/1992 | Campbell et al. | 156/643 |
| 5,217,560 | 6/1993 | Kurono et al. | 156/345 |
| 5,304,282 | 4/1994 | Flamm | 156/643 |
| 5,401,350 | 3/1995 | Patrick et al. | 156/345 |
| 5,429,070 | 7/1995 | Campbell et al. | 118/723 R |
| 5,464,476 | 11/1995 | Gibb et al. | 118/723 MP |

OTHER PUBLICATIONS

Okumura et al., High Density Plasma Etching Apparatus "E620/E630" of Denshi Zairyo, Mar. 1995, pp. 1–2.
Okumura et al., 8th Symposium on Plasma Science for Materials, Japan Society for the Promotion of Science, Committee 153, Jun. 1995.
Matsushita Electric Industrial Co., Ltd., Catalog of Dry Etching Apparatus E620 for Silicone Compounds, Dec. 1994.

Primary Examiner—R. Bruce Breneman
Assistant Examiner—Joni Y. Chang
Attorney, Agent, or Firm—Wenderoth, Lind & Ponack

[57] ABSTRACT

A plasma processing apparatus includes a vacuum vessel, a substrate electrode, a discharge coil which is partially or wholly made to have a multiple spiral or helical configuration, a high frequency power source, and a matching circuit that is connected to the discharge coil by way of a conductor wire and connected to the high frequency power source via a connection cable, and generates plasma inside the vacuum vessel by applying a high frequency voltage to the discharge coil so as to process a substrate disposed on the substrate electrode.

8 Claims, 10 Drawing Sheets

PLASMA PROCESSING APPARATUS

BACKGROUND OF THE INVENTION

The present invention relates to a plasma processing apparatus capable of being used for dry etching, sputtering, plasma CVD and the like in a process of manufacturing a semiconductor and a thin film circuit, and in particular to a high frequency inductive coupled plasma processing apparatus.

In recent years, to effect processing or the like on a semiconductor element at a high aspect ratio by a dry etching technique or effect burying or the like at a high aspect ratio by a plasma CVD technique, coping with developing dimensional fineness of semiconductor elements, it has been required to effect plasma processing in higher vacuum.

For instance, in the case of dry etching, when a high density plasma is generated in high vacuum, there is a reduced possibility of collision between ions and neutral radical particles in anion sheath formed on a substrate surface, and therefore directions of the ions are aligned toward the substrate surface. Furthermore, because of a high degree of electrolytic dissociation, there results a high incident particle flux ratio of ions to neutral radicals arriving at the substrate. For the above-mentioned reasons, etching anisotropy is improved by generating a high density plasma in high vacuum, thereby allowing processing to be achieved at a high aspect ratio.

Furthermore, in the case of plasma CVD, when a high density plasma is generated in high vacuum, an effect of burying and flattening a fine pattern can be obtained by the sputtering effect with ions, thereby allowing burying to be achieved at a high aspect ratio.

A conventional generic parallel flat plate type plasma processing apparatus will be described with reference to FIG. 7. In FIG. 7, a substrate electrode 4 on which a substrate 5 is to be disposed and an opposite electrode 30 are provided inside a vacuum vessel 3, and a high frequency voltage is applied across the electrodes 4 and 30 from an electrode-use high frequency power source 6, so that plasma is generated inside the vacuum vessel 3. It is to be noted that an electrode-use matching circuit 7 is a circuit for matching a load impedance with a characteristic impedance of an electrode-use connection cable 8.

According to the above-mentioned system, the probability of collisions between electrons and ions reduces according as the degree of vacuum increases. Therefore, it is difficult to generate a high density plasma in high vacuum, and consequently sufficient velocity of processing cannot be obtained. Furthermore, when the high frequency voltage is irrationally increased so as to increase the plasma density, an ion energy increases and this results to possibly reduce etch selectivity or cause damage to the substrate.

In contrast to the above-mentioned parallel flat plate type plasma processing apparatus, there is a high frequency inductive coupled plasma processing apparatus which generates plasma in its vacuum vessel by applying a high frequency voltage to its discharge coil, as a plasma processing apparatus capable of generating a high density plasma in high vacuum. The plasma processing apparatus of the above-mentioned type generates a high frequency magnetic field in the vacuum vessel and generates an induction electric field inside the vacuum vessel by means of the high frequency magnetic field so as to accelerate electrons and generate plasma. By increasing a coil current, a high density plasma can be generated even in high vacuum, and consequently a sufficient velocity of processing can be obtained.

As the high frequency inductive coupled plasma processing apparatus, principally a flat plate type as shown in FIG. 8 and a cylinder type as shown in FIG. 9 are known. In FIGS. 8 and 9, there are shown a flat plate type discharge coil 31, a cylinder type discharge coil 32, a discharge coil-use high frequency power source 9, a discharge coil-use matching circuit 10, and a discharge coil-use connection cable 11. The discharge coil-use matching circuit 10 is connected to each of the discharge coils 31 and 32 by way of a conductor wire 12. It is to be noted that the vacuum vessel 3, substrate electrode 4, substrate 5, electrode-use high frequency power source 6, electrode-use matching circuit 7, and electrode-use connection cable 8 are the same as those of FIG. 7.

In FIGS. 8 and 9, upon applying a high frequency voltage to each of the discharge coils 31 and 32 from the discharge coil-use high frequency power source 9 while introducing an appropriate gas into the vacuum vessel 3 and discharging a gas therefrom with the vacuum vessel 3 kept internally at an appropriate pressure, there is generated plasma inside the vacuum vessel 3, thereby allowing the substrate 5 disposed on the substrate electrode 4 to be processed with plasma processing such as etching, deposition, and surface improvement. In the above place, by additionally applying a high frequency voltage to the substrate electrode 4 from the electrode-use high frequency power source 6, energy of ions reaching the substrate 5 can be controlled.

However, according to the conventional systems shown in FIGS. 8 and 9, there is a great power loss in the discharge coil-use matching circuit 10, and this results in the disadvantages of a lowered power efficiency and a possible temperature rise in the discharge coil-use matching circuit 10.

The above-mentioned disadvantages will be described in detail below. FIG. 10 is a circuit diagram of a representative one of the discharge coil-use matching circuit 10. There are included an input terminal 13, variable capacitors 14 ! and 15, and a matching-use series coil 16. By controlling the capacitances of the variable capacitors 14 and 15 in a feedback manner, the circuit can cope with a very small fluctuation of the load impedance. Depending on the magnitude of the load impedance, it is required to change the number of turns of the matching-use series coil 16, remove the matching-use series coil 16, or insert a fixed capacitor 17 or 18. A reference numeral 19 denotes an output terminal.

FIG. 11 is a Smith chart, in which the hatched area shows a range of matching of the discharge coil-use matching circuit 10 shown in FIG. 10. As might be expected, the range of matching shown in FIG. 11 varies depending on constants of elements in the discharge coil-use matching circuit 10, however, there is shown a representative case as an example. In regard to a complex representation of impedance of the discharge coil 31 or 32, there is shown by a curve A the impedance of the discharge coil 31 or 32 in a case where its imaginary number component is five times as great as a characteristic impedance of the discharge coil-use connection cable 11. It can be found in FIG. 11 that a greater part of the curve A is out of the range of matching.

In view of the above, there is a discharge coil-use matching circuit 10 as shown in FIG. 12 in which is connected a matching-use parallel coil 20 having an impedance equal to that of the imaginary number component of the complex representation of the impedance of the discharge coil 31 or 32. In the above case, an impedance at the load side evaluated from a load-side terminal of the variable capacitor 25 has its imaginary number component being half of the curve A, i.e., two and half times as great as the characteristic impedance of the discharge coil-use connection cable 11. Therefore, the impedance is expressed by a curve B as shown in FIG. 11. Normally, a real number component of the impedance of the discharge coil 31 or 32 is extremely small, and therefore a part of the curve B (most part of a range in which the real number component is not greater than 1.3 times the characteristic impedance of the discharge coil-use connection cable 11) is in the range of matching. Accordingly, it can be understood that matching can be achieved by using the matching-use parallel coil 20.

The above has described the case where the impedance of the matching-use parallel coil 20 is equal to the impedance of the discharge coil 31 or 32. However, when the impedance of the discharge coil 31 or 32 is great, there can be achieved no matching unless the impedance of the matching-use parallel coil 20 is reduced to a considerably small extent. Otherwise, when the impedance of the discharge coil 31 or 32 is not so great, the smaller the imaginary number component of the impedance at the load side evaluated from the load-side terminal of the variable capacitor 15, the wider a margin for the matching results. Therefore, the impedance of the matching-use parallel coil 20 is preferably as small as possible. In such a case, the matching-use parallel coil 20 and the discharge coil 31 or 32 are connected in parallel with each other in terms of circuit construction, and there fore a greater current flows through the matching-use parallel coil 20 than the discharge coil 31 or 32. Therefore, even when the real number component of the impedance of the matching-use parallel coil 20 is a small value, the power loss occurring there cannot be ignored, and the power efficiency is lowered. Since the power loss is equivalent to a calorific value of the matching-use parallel coil 20, a temperature rise in the discharge coil-use matching circuit 10 will result.

Furthermore, in the case of the flat plate type high frequency inductive coupled plasma processing apparatus, there is required a discharge coil 31 having at least the same size as that of the substrate 5 in order to generate plasma inside the vacuum vessel 3 with a good intra-substrate-surface uniformity. In regard to the configuration of the discharge coil 31, there can be considered a one-turn coil as shown in FIG. 13. In general, the inductance of a coil increases according as the diameter of the coil increases, and consequently, the inductance of the discharge coil 31 cannot help increasing when the substrate 5 is large. Furthermore, in order to further improve the intra-substrate-surface uniformity, the configuration of the discharge coil 31 is preferably a spiral coil as shown in FIG. 14. Comparing the spiral coil with the one-turn coil, of course the spiral coil has a greater inductance when the outermost diameters of the discharge coils 31 are approximately identical. According to our measurement, the inductance of a spiral discharge coil 31 such that the uniformity in density of plasma is not greater than 3% at a diameter of 150 mm is 1.1 µH in a certain discharge condition. When the frequency of the discharge coil-use high frequency power source 9 is 13.56 MHz, the imaginary number component of the impedance of the discharge coil 31 is 94 Ω, i.e., slightly smaller than two times a normal value of 50 Ω of the characteristic impedance of the discharge coil-use connection cable 11. Around the above-mentioned value, it is possible to achieve matching without the matching-use parallel coil 20. However, as described hereinbefore, taking a margin for the matching into account, it is preferable to insert a coil of about 0.5 to 1 µH as the matching-use parallel coil 20 in terms of margin for the matching.

The impedance of the discharge coil 31 is proportional to the frequency. Therefore, for example, when the frequency of the discharge coil-use high frequency power source 9 is 40 MHz, the impedance of the discharge coil 31 having an inductance of 1.1 µH is about 276 Ω (=50 Ω×5.5), meaning that the matching-use parallel coil 20 is indispensable in achieving matching.

In order to generate a uniform plasma for a great area when the substrate 5 is large or when a batch processing is desired robe effected, the discharge coil 31 is of course required to be dimensionally increased. Even when the frequency of the discharge coil-use high frequency power source 9 is 13.56 MHz, the impedance of the discharge coil 31 sometimes becomes several hundred ohms. In this case, the matching-use parallel coil 20 is indispensable for the achievement of matching.

In view of the above, there can be considered a method of connecting a plurality of spiral coils in parallel with each other in a manner as shown in FIG. 15 as a discharge coil arrangement capable of generating a uniform plasma for a great area and reducing the impedance of the discharge coil 31. However, when such a discharge coil arrangement is adopted, high frequency magnetic fields formed by adjacent coils partially cancel each other, consequently causing the disadvantage that a sufficient plasma density cannot be obtained. According to our measurement, when four same spiral coils are used in a parallel connection, a total inductance of the discharge coils is 0.51 µH, i.e., reduced to 59% of that of a case where one spiral coil of 1.3 µH is used, whereas the plasma density is disadvantageously reduced by 11%.

In the case of the cylinder type high frequency inductive coupled plasma processing apparatus, the helical type discharge coil 32 is provided around the vacuum vessel 3, and therefore a helical type discharge coil 32 having at least the same size as the exterior size of the vacuum vessel 3 is to be used. Therefore, generally the inductance of the discharge coil 32 increases as compared with that of the flat plate type high frequency inductive coupled plasma processing apparatus. Therefore, in order to achieve matching or secure a margin for the matching, there are many cases requiring the matching-use parallel coil 20. According to our measurement, when the diameter of the cylinder is 300 mm, the inductance of the helical type discharge coil 32 is 1.8 µH (=150 Ω at 13.56 MHz).

As apparent from the above description, the matching-use parallel coil 20 is required for the purpose of increasing the size of the processing area, increasing the inductance of the discharge coil 31 or 32 for increasing the application frequency, or increasing the margin for the matching. However, when the matching-use parallel coil 20 is used and particularly the imaginary number component of the impedance thereof is small, there is inevitably produced power loss together with a lowered power efficiency. Since the power loss is equivalent to the calorific value of the matching-use parallel coil 20, a temperature rise in the discharge coil-use matching circuit 10 has resulted disadvantageously.

SUMMARY OF THE INVENTION

An object of the present invention is to provide an inductive coupled plasma processing apparatus that is not required to use a special coil having an impedance of which imaginary number component is small or necessitates no matching-use parallel coil, therefore achieving a power efficiency lowered less and a small temperature rise in the discharge coil-use matching circuit.

In accomplishing these and other aspects, according to one aspect of the present invention, there is provided a plasma processing apparatus comprising:

- a vacuum vessel;
- a substrate electrode;
- a discharge coil which is partially or wholly made to have a multiple spiral configuration;
- a high frequency power source; and
- a matching circuit that is connected to the discharge coil by way of a conductor wire and connected to the high frequency power source via a connection cable, and generates plasma inside the vacuum vessel by applying a high frequency voltage to the discharge coil so as to process a substrate disposed on the substrate electrode.

According to another aspect of the present invention, there is provided a plasma processing apparatus comprising:

- a vacuum vessel;
- a substrate electrode;
- a discharge coil which is partially or wholly made to have a multiple helical configuration;
- a high frequency power source; and
- a matching circuit that is connected to the discharge coil by way of a conductor wire and connected to the high frequency power source via a connection cable, and generates plasma inside the vacuum vessel by applying a high frequency voltage to the discharge coil so as to process a substrate disposed on the substrate electrode.

According to the plasma processing apparatus of the first and second aspects of the present invention, a part or all of the discharge coils has a multiple spiral or helical configuration. With the above-mentioned arrangement, the impedance of the discharge coil can be reduced, and consequently matching can be achieved without specifically using a matching-use parallel coil having an impedance of which imaginary number component is small. Therefore, an inductive coupled plasma processing apparatus in which power efficiency is lowered less and temperature rises less in the discharge coil-use matching circuit can be provided.

Furthermore, when the imaginary number component of the complex representation of the impedance of the discharge coil is made to be not greater than five times the characteristic impedance of the connection cable, matching can be achieved without using a matching-use parallel coil. Therefore, an inductive coupled plasma processing apparatus free from lowering of power efficiency and temperature rise in the discharge coil-use matching circuit can be provided.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
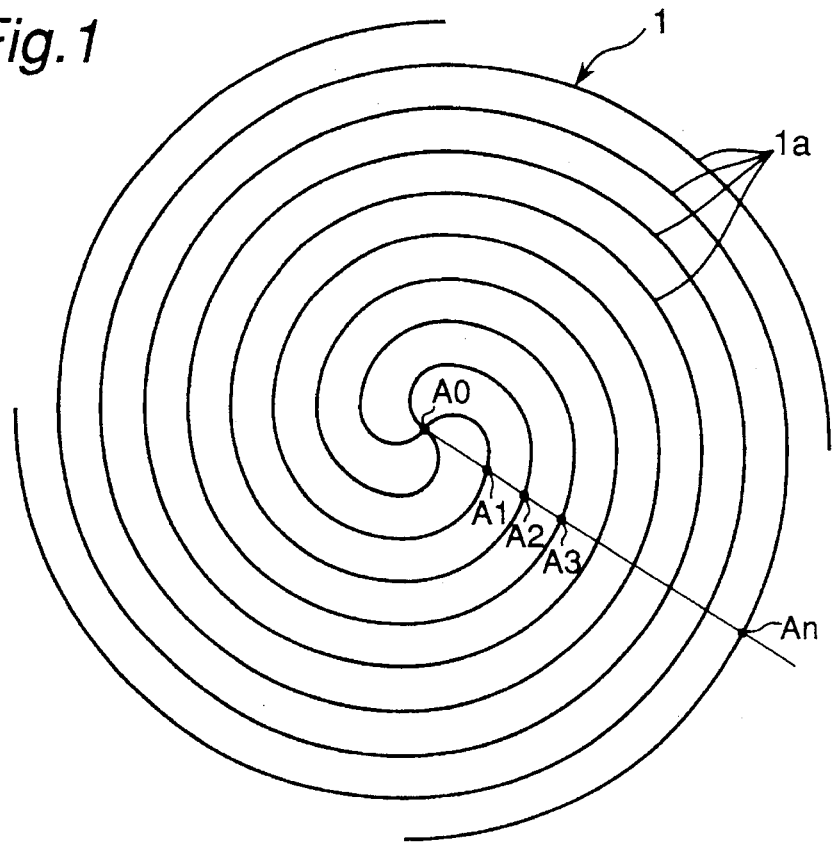
FIG. 1 is a plan view showing a configuration of a discharge coil of a plasma processing apparatus according to a first embodiment of the present invention.

Before the description of the present invention proceeds, it is to be noted that like parts are designated by like reference numerals throughout the accompanying drawings.

A plasma processing apparatus of a first embodiment of the present invention will be described below with reference to FIGS. 1 and 8. It is to be noted that the construction of the plasma processing apparatus is similar to that of the conventional apparatus described with reference to FIG. 8. Therefore, reference should be made to the description, and no further description is provided therefor herein.

Figure 8:
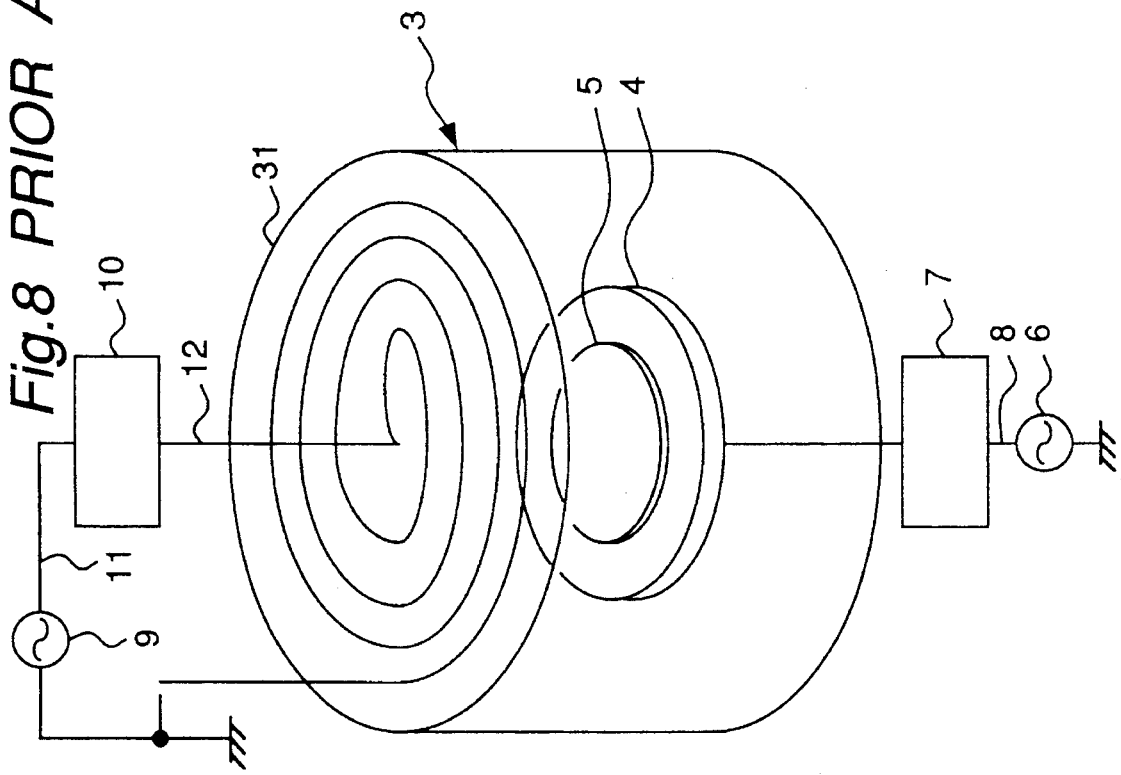
FIG. 8 is a structural diagram of a conventional parallel plate type high frequency inductive coupled plasma processing apparatus.
Figure 7:
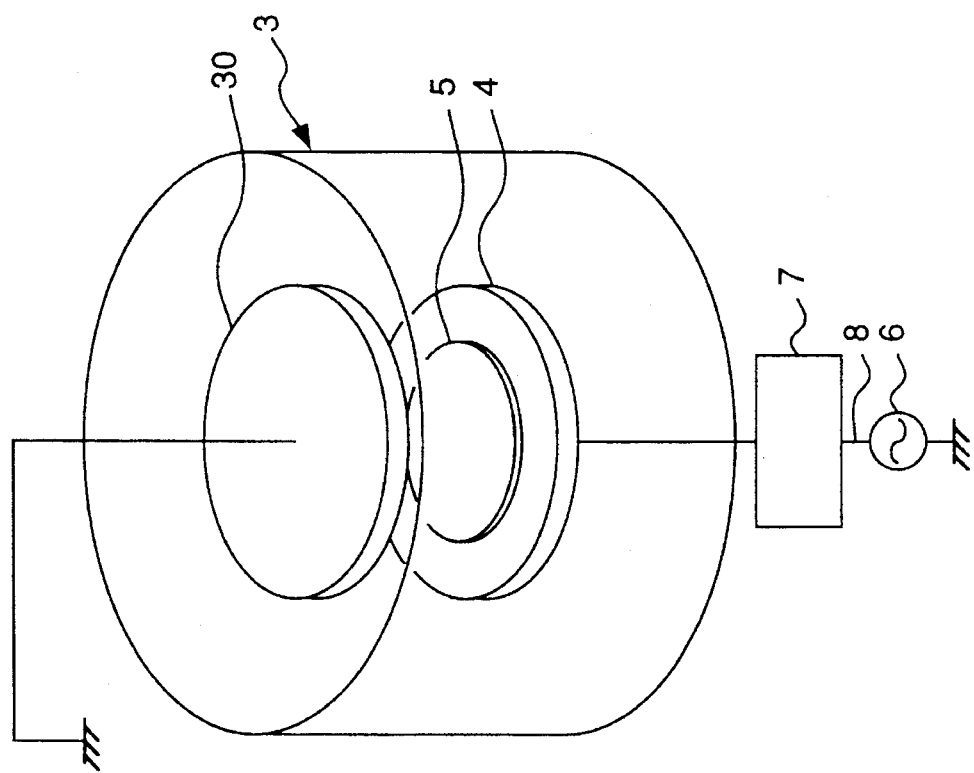
FIG. 7 is a structural diagram of a conventional parallel plate type plasma processing apparatus.

In the present embodiment, a multiple spiral discharge coil 1 is used as shown in FIG. 1 instead of the discharge coil 31 shown in FIG. 8. The discharge coil 1 has a construction in which four spiral discharge coil elements 1a are combined with each other at a central portion as arranged circumferentially at equal intervals, the central portion is connected to the high frequency power source 9, and the peripheral ends are grounded.

As shown in FIG. 1, a straight line passing through a center $A_0$ of the discharge coil 1 crosses with the spiral discharge coil elements 1a, which are conductive wires constructing the discharge coil 1, at points $A_1, A_2, A_3, \ldots, A_n$, and a distance between the adjacent points $A_0$ and $A_1$ is larger than any of distances between the other two adjacent points $A_1, A_2, \ldots, A_n$. The distribution of the intra-substrate-surface of the plasma density in this arrangement is considerably improved as compared with a case where the distance between the points $A_0$ and $A_1$ is not larger than any of the distances between the other points. That is, in order to obtain such an effect, it is preferable that a distance between adjacent conductive wires on the center side of the discharge coil 1 is larger than any of distances between the other adjacent conductive wires on the peripheral side of the discharge coil 1.

Figure 11:
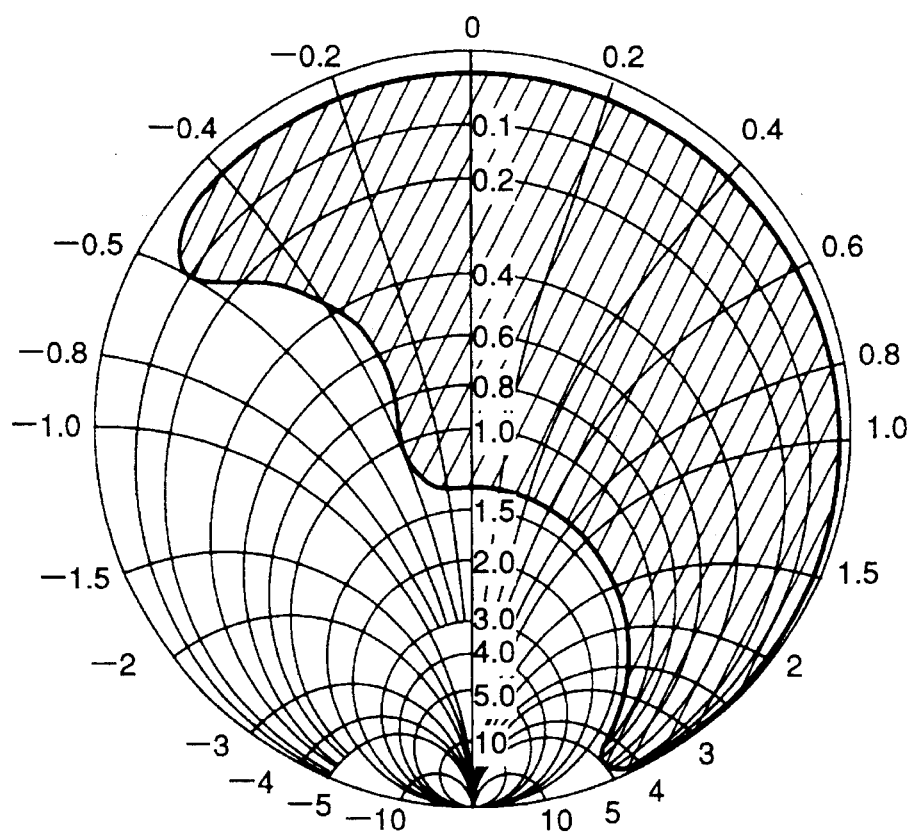
FIG. 11 is a Smith chart showing a range of matching of the matching circuit shown in FIG. 10.
Figure 12:
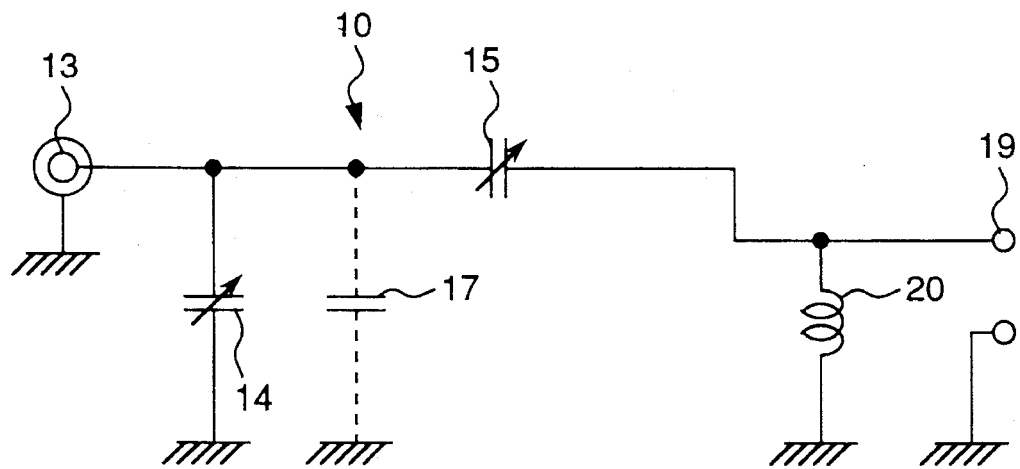
FIG. 12 is a circuit diagram of a discharge coil-use matching circuit employing a matching-use parallel coil.
Figure 13:
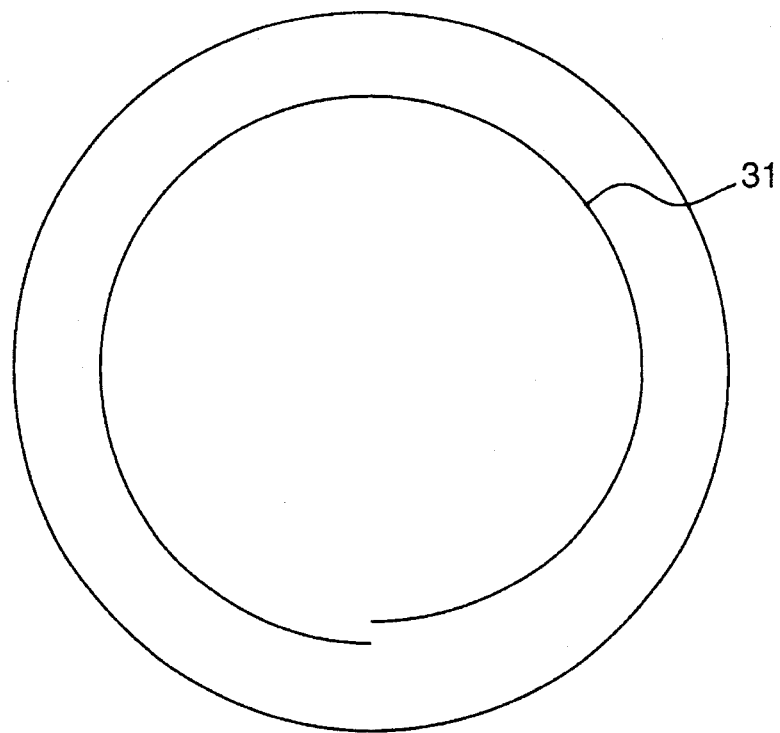
FIG. 13 is a plan view showing a detail of a conventional discharge coil.
Figure 14:
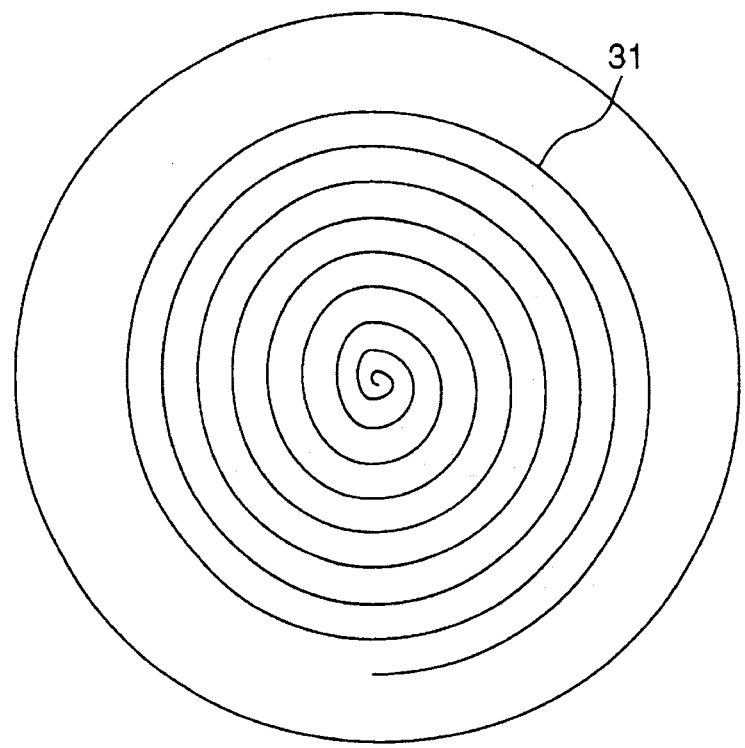
FIG. 14 is a plan view showing a detail of another conventional discharge coil.
Figure 15:
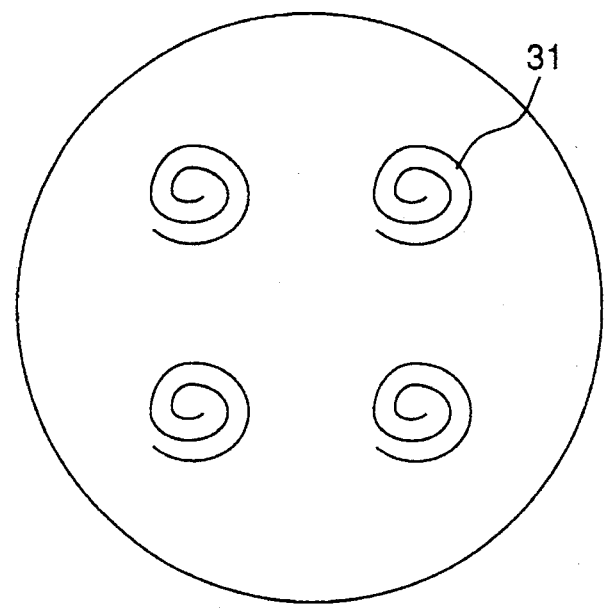
FIG. 15 is a plan view showing a detail of yet another conventional discharge coil.

In the plasma processing apparatus having the above-mentioned construction, an impedance of the discharge coil 1 is measured under the conditions that: argon flow rate is 30 SCCM; pressure is 10 mTorr; frequencies of the discharge coil-use high frequency power source 9 and the substrate electrode-use high frequency power source 6 are each 13.56 MHz; and feed powers are 1000 W and 300 W respectively. The measurement result is $1.5\ \Omega + j51\ \Omega$. It is to be noted that a discharge coil-use connection cable 11 having a characteristic impedance of 50 $\Omega$ is used, and therefore the imaginary number component of the impedance of the discharge coil 1 is approximately equal to the characteristic impedance of the discharge coil-use connection cable 11. Therefore, as apparent from the Smith chart of FIG. 11, matching can be achieved without using the matching-use parallel coil 20, and a sufficient margin for the matching can be assured. Further, the intra-substrate-surface uniformity of the plasma density is not greater than 3% within a diameter of 150 mm, and the plasma density is not significantly different from the case of the flat plate type discharge coil 31 (FIG. 14) shown in a conventional one. In the case of the flat plate type discharge coil 31 shown in the conventional one, the imaginary number component of the impedance of the discharge coil is 94 $\Omega$. Therefore, according to the present embodiment, there is obtained a plasma equivalent to that of the conventional one as compared with each other, and the imaginary number component of the impedance of the discharge coil is able to be limited to 54% of that of the conventional one.

A further experiment is carried out by changing the frequency of the discharge coil-use high frequency power source 9 to 40 MHz. Since the imaginary number component of the impedance is 150 $\Omega$ (=50 $\Omega \times 3$) in the multiple spiral discharge coil 1, matching is able to be achieved without using the matching-use parallel coil 20 in contrast to the fact that no matching is able to be achieved without the matching-use parallel coil 20 in the case of the conventional spiral discharge coil 31. In order to assure more margin for the matching, the matching-use parallel coil 20 may be used. However, the impedance of the matching-use parallel coil 20 required for the assurance of about same degree of margin is allowed to be far greater when the multiple spiral type discharge coil 1 is used, and therefore the power loss at the matching-use parallel coil 20 is allowed to be far smaller. It is to be noted that the imaginary number component of the impedance of the multiple spiral type discharge coil 1 becomes 250 $\Omega$ (=50 $\Omega \times 5$) when the power frequency is at 67 MHz. Therefore, when the margin is ignored, matching can be achieved by the multiple spiral type discharge coil 1 shown in FIG. 1 without the matching-use parallel coil 20 at a frequency of not greater than about 60 MHz.

Next, a plasma processing apparatus according to a second embodiment of the present invention will be described with reference to FIGS. 2 and 9. It is to be noted that the total construction of the plasma processing apparatus is similar to that of the conventional apparatus described with reference to FIG. 9. Therefore, reference should be made to the description, and no further description is provided therefor herein.

Figure 2:
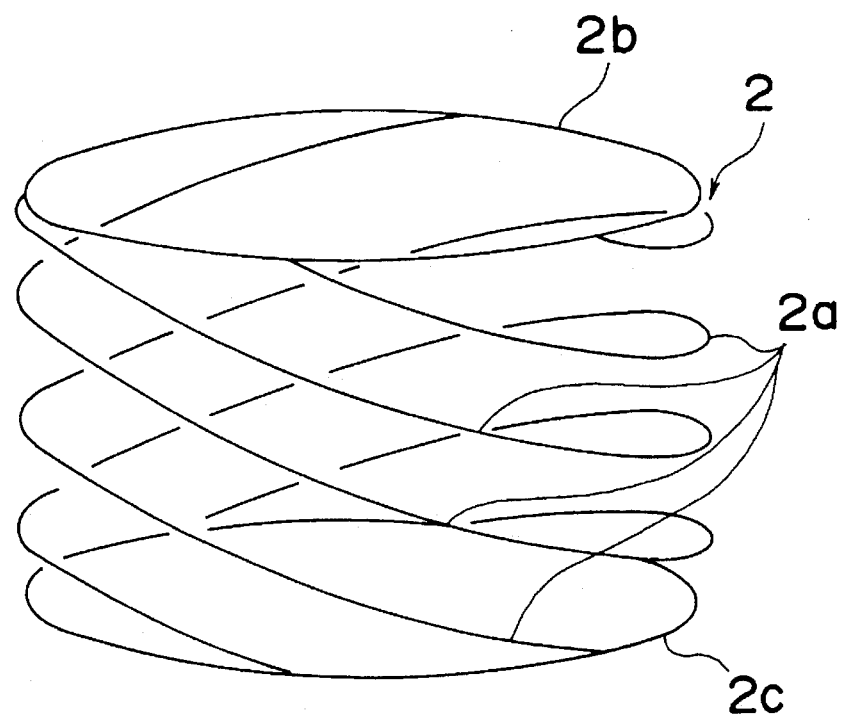
FIG. 2 is a perspective view showing a configuration of a discharge coil of a plasma processing apparatus according to a second embodiment of the present invention.
Figure 9:
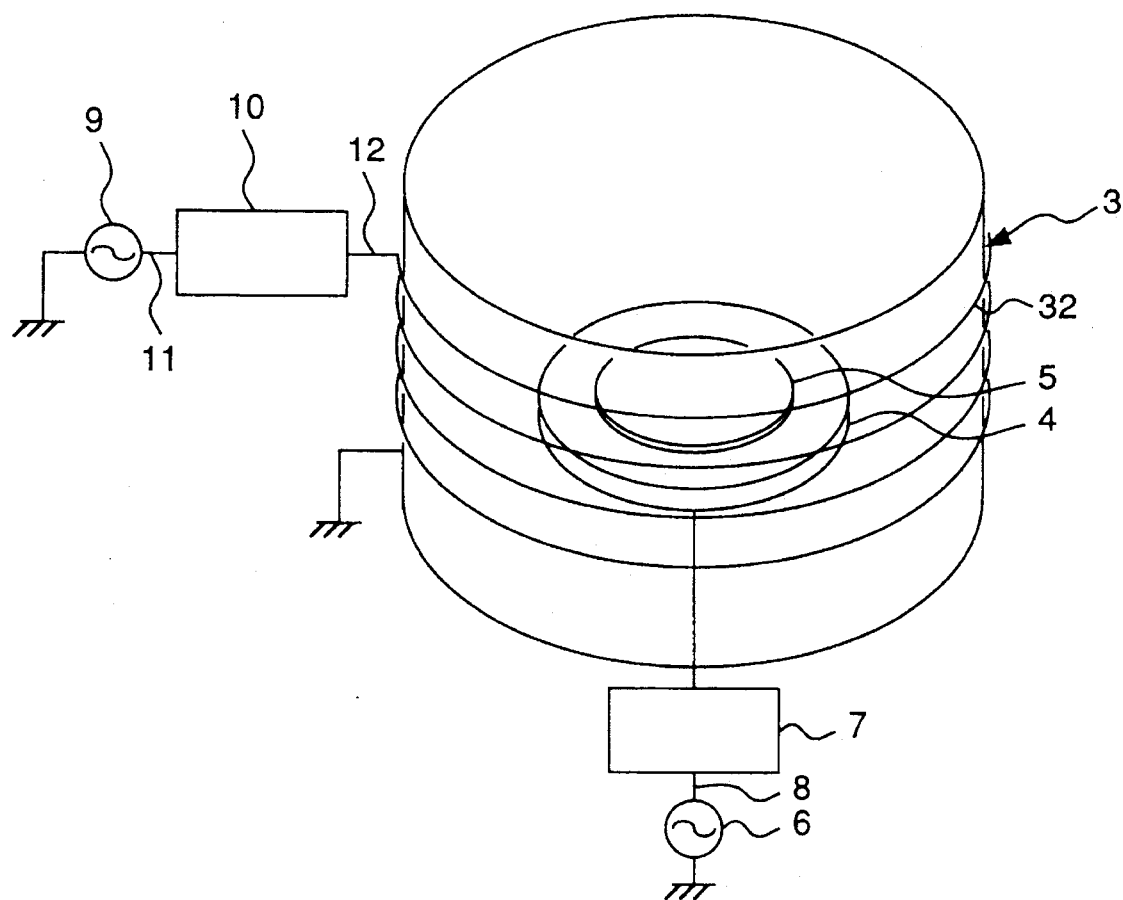
FIG. 9 is a structural diagram of a conventional cylinder type high frequency inductive coupled plasma processing apparatus.
Figure 10:
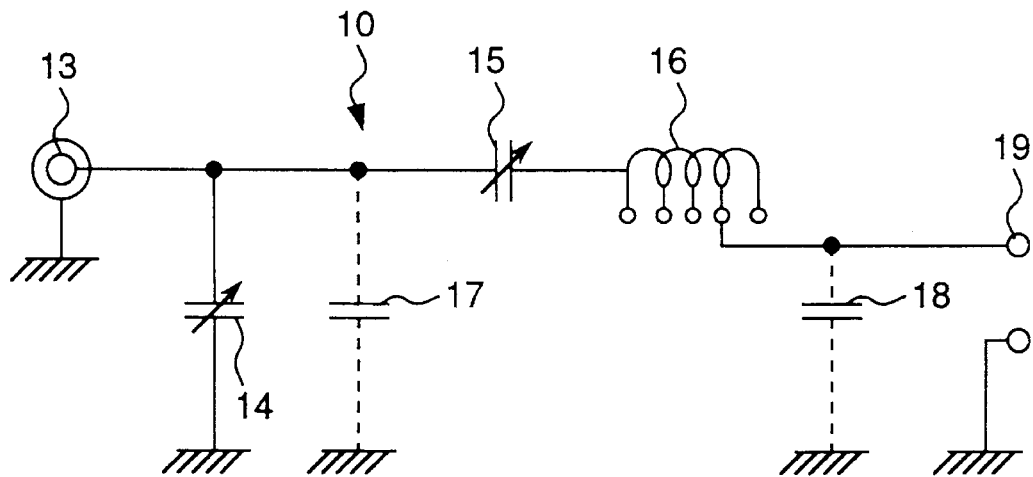
FIG. 10 is a circuit diagram of a representative discharge coil-use matching circuit.

In the second embodiment, a multiple helical discharge coil 2 as shown in FIG. 2 is used instead of the discharge coil 32 shown in FIG. 9. The discharge coil 2 has a construction in which four helical discharge coil elements 2a are arranged circumferentially at equal intervals, both ends of the coil elements 2a are connected to annular coils 2b and 2c; one annular coil 2b is connected to the high frequency power source 9, and the other annular coil 2c is grounded.

In the plasma processing apparatus having the above-mentioned construction, the impedance of the discharge coil 2 is measured under the conditions that: argon flow rate is 30 SCCM; pressure is 10 mTorr; frequencies of the discharge coil-use high frequency power source 9 and the substrate electrode-use high frequency power source 6 are each 13.56 MHz; and feed powers are 1000 W and 300 W respectively. The measurement result is $1.8\ \Omega + j79\ \Omega$. It is to be noted that a discharge coil-use connection cable 11 having a characteristic impedance of 50 $\Omega$ is used, and therefore the imaginary number component of the impedance of the discharge coil 2 is 1.6 times as great as the characteristic impedance of the discharge coil-use connection cable 11. Therefore, as apparent from the Smith chart of FIG. 11, matching can be achieved without using the matching-use parallel coil 20, and a sufficient margin for the matching can be assured. The plasma density is not significantly different from that of the cylinder type discharge coil 32 shown as the conventional one. In the case of the cylinder type discharge coil 32 shown in the conventional one, the imaginary number component of the impedance of the discharge coil is 150 $\Omega$. Therefore, according to the present second embodiment, there is obtained plasma equivalent to that of the conventional one as compared with each other, and the imaginary number component of the impedance of the discharge coil is able to be limited to 53% of that of the conventional one.

A further experiment is carried out by changing the frequency of the discharge coil-use high frequency power source 9 to 27 MHz. Since the imaginary number component of the impedance is 158 $\Omega$ (=50 $\Omega \times 3.2$) in the multiple helical discharge coil 2, matching is able to be achieved without using the matching-use parallel coil 20 in contrast to the fact that no matching is able to be achieved without the matching-use parallel coil 20 in the case of the conventional cylinder type discharge coil 32. In order to assure more margin for the matching, the matching-use parallel coil 20 may be used. However, the impedance of the matching-use parallel coil 20 required for the assurance of about same degree of margin is allowed to be far greater when the multiple helical discharge coil 2 is used, and therefore the power loss at the matching-use parallel coil 20 is allowed to be far smaller. It is to be noted that the imaginary number component of the impedance of the multiple helical discharge coil 2 becomes 250 $\Omega$ (=50 $\Omega \times 5$) when the power frequency is at 43 MHz. Therefore, when the margin is ignored, matching can be achieved by the multiple helical discharge coil 2 shown in FIG. 2 at a frequency of not greater than about 40 MHz, without the matching-use parallel coil 20.

In each of the aforementioned embodiments, the configurations of the discharge coils are not limited to these. For instance, the degree of multiplicity of the spiral coil and the helical coil is not limited to four in number, but each coil may have any degree of multiplicity. The impedance of the discharge coil can be reduced according as the degree of multiplicity is increased, and this allows each apparatus to cope with a greater processing area and a higher power frequency. Furthermore, it is not always required for all the discharge coil elements to have the multiple spiral configuration or the multiple helical configuration. As shown in FIGS. 3, 4, 5, and 6, each discharge coil may partially have the multiple spiral configuration or the multiple helical configuration.

Figure 3:
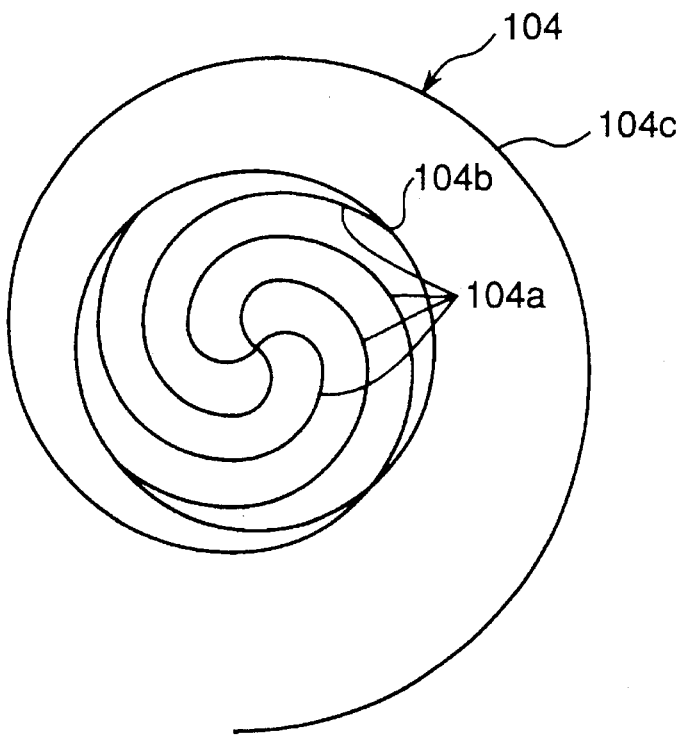
FIG. 3 is a plan view showing a configuration of a discharge coil according to another embodiment of the present invention.
Figure 4:
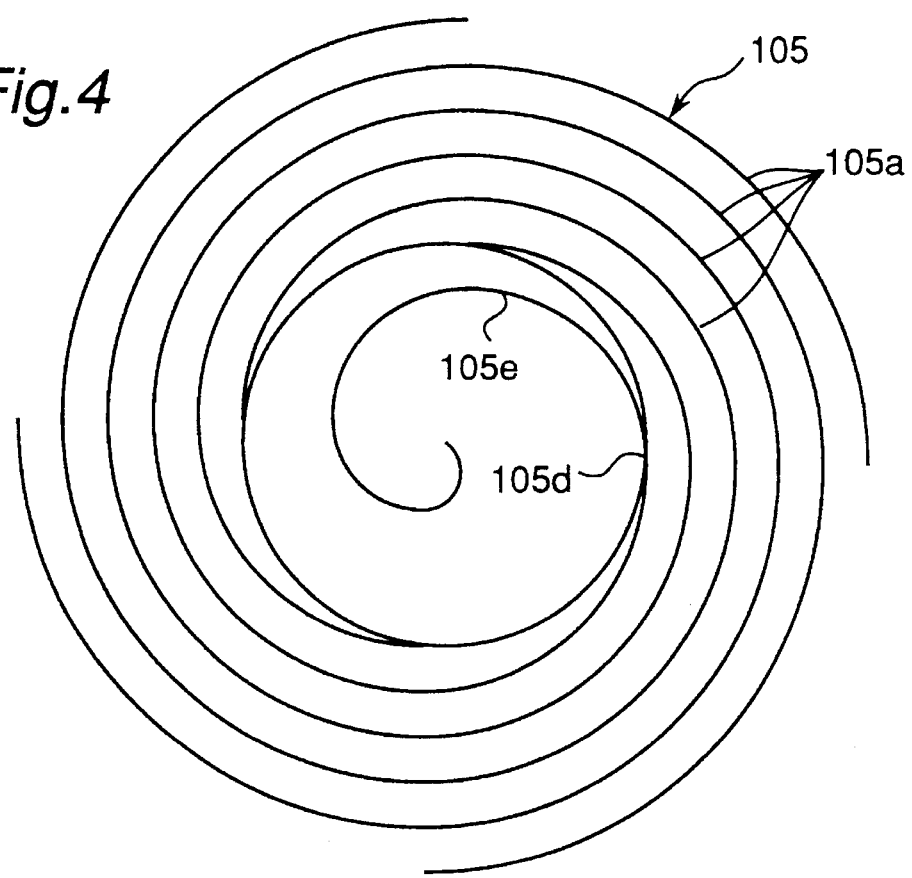
FIG. 4 is a plan view showing a configuration of a discharge coil according to yet another embodiment of the present invention.
Figure 6:
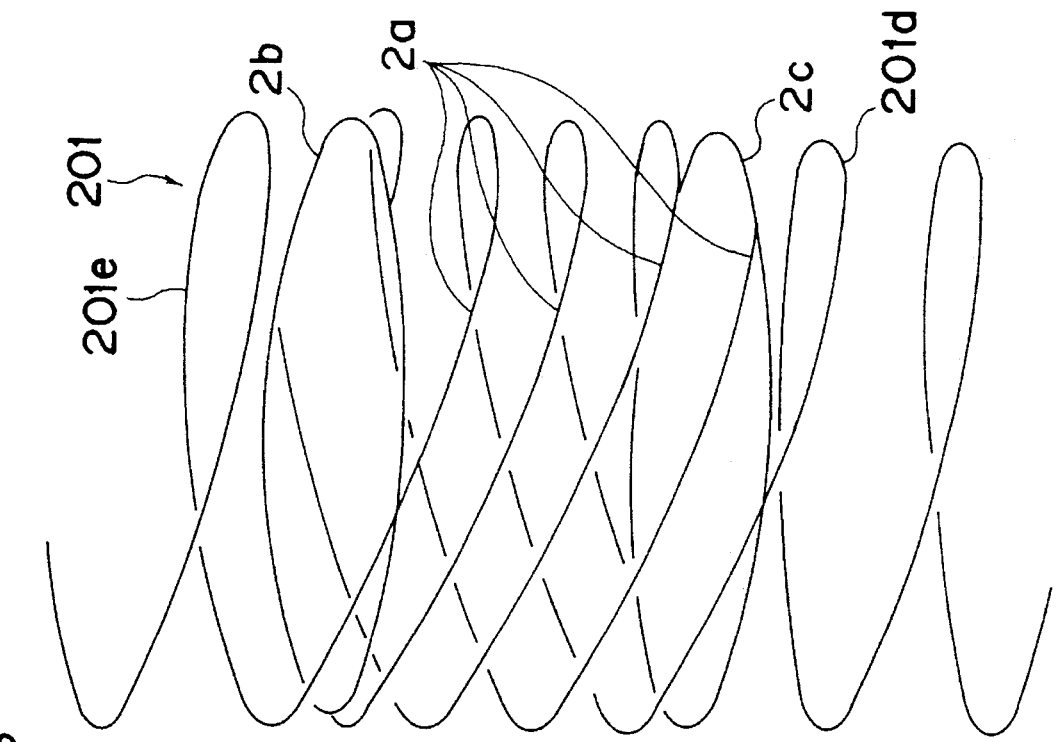
FIG. 6 is a perspective view showing a configuration of a discharge coil according to yet another embodiment of the present invention.

In the example shown in FIG. 3, a central portion is comprised of a multiple spiral type coil 104, outer ends of spiral coil elements 104a like the spiral discharge coil elements 1a are connected to an annular coil 104b, and a normal spiral coil 104c is connected outwardly from the annular coil 104b. In the example shown in FIG. 4, a peripheral portion is comprised of a multiple spiral type coil 105, inner ends of the spiral coil elements 105a are connected to an annular coil 105d, and a normal spiral coil 105e is connected inwardly from the annular coil 105d.

Figure 5:
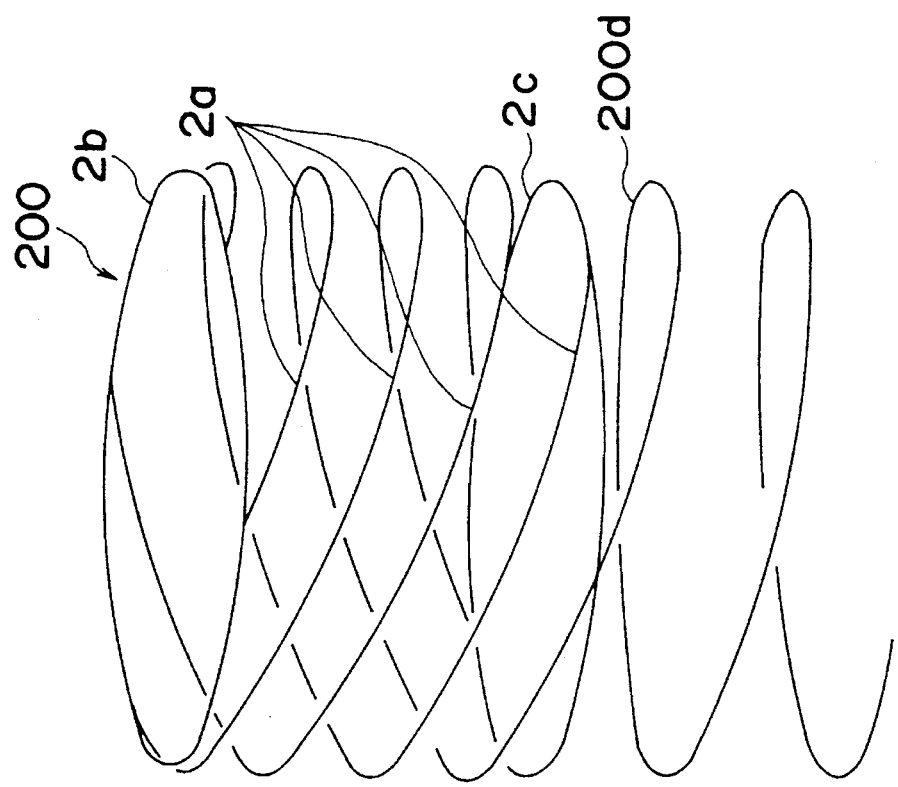
FIG. 5 is a perspective view showing a configuration of a discharge coil according to yet another embodiment of the present invention.

In a discharge coil 200 as an example shown in FIG. 5, a normal helical coil 200d is connected downwardly from the multiple helical type coil 2 of FIG. 2. In a discharge coil 201 as an example shown in FIG. 6, normal helical coils 201d and 201e are connected upwardly and downwardly from the multiple helical type coil 2 of FIG. 2.

Figure 16:
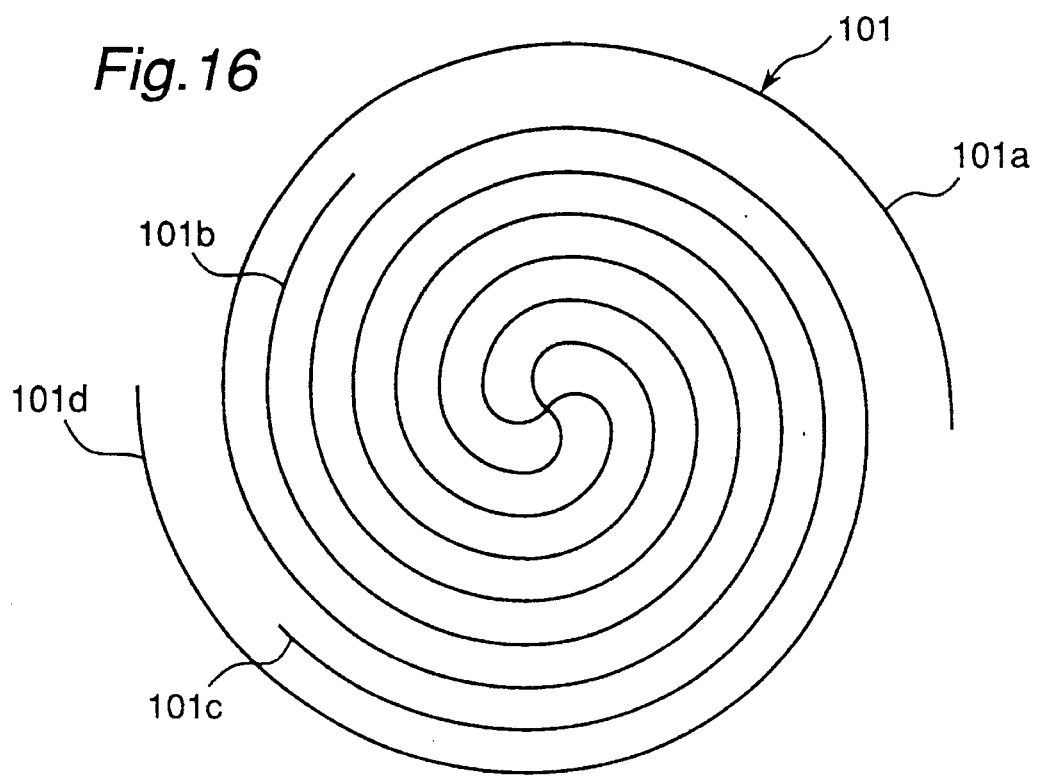
FIG. 16 is a plan view showing a configuration of a discharge coil of a plasma processing apparatus according to another embodiment of the present invention.
Figure 19:
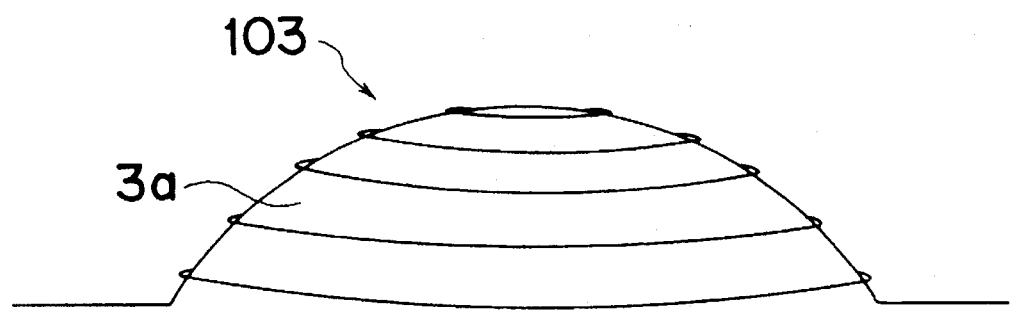
FIG. 19 is a side view of the discharge coil of the plasma processing apparatus in FIG. 18.
Figure 18:
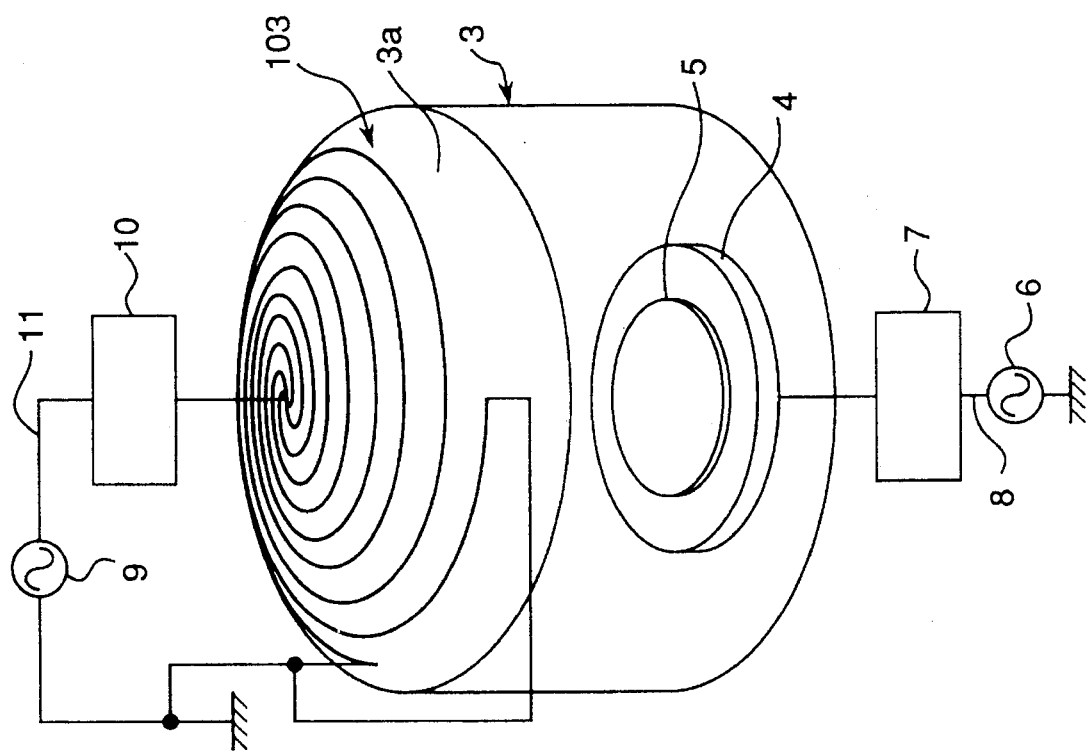
FIG. 18 is a structural diagram of a plasma processing apparatus according to another embodiment of the present invention.
Figure 17:
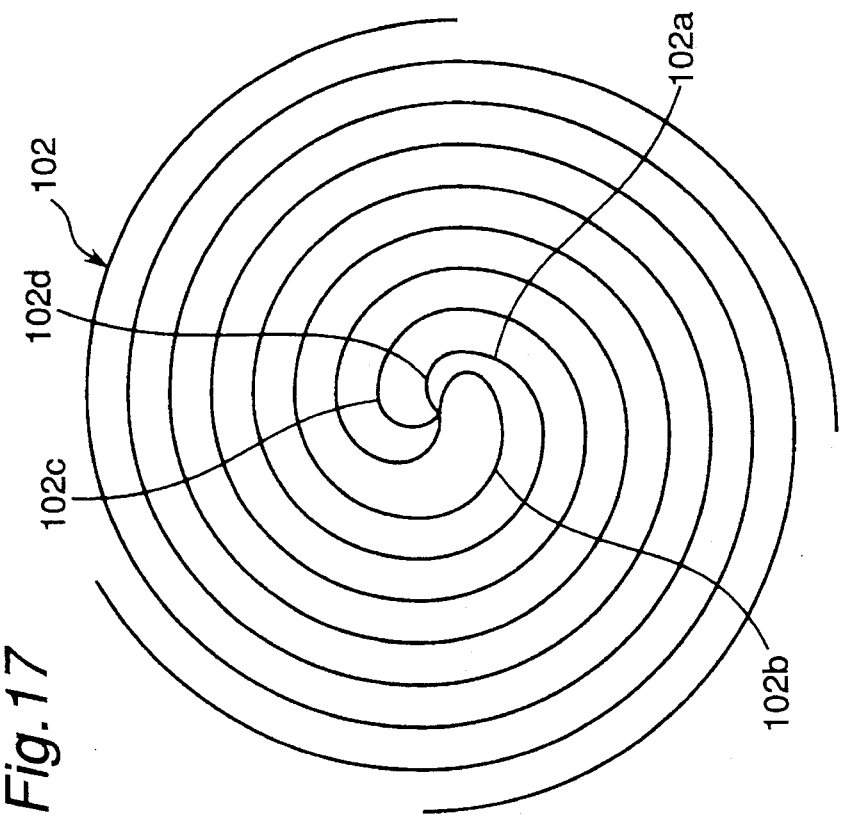
FIG. 17 is a plan view showing a configuration of a discharge coil of a plasma processing apparatus according to another embodiment of the present invention.

Although center-side ends of the conductive wires 1a, i.e. the spiral discharge coil elements 1a having the same configuration are connected to each other at the center $A_0$ of the discharge coil 1 for every 90 degrees in FIG. 1 which has a symmetrical configuration with the center of the discharge coil 1, another arrangements may be applied to discharge coils. For example, as shown in FIG. 16, center-side ends of spiral discharge coil elements 101a, 101b, 101c, 101d of different configurations may be connected to each other at the center of a discharge coil 101. Alternatively, as shown in FIG. 17, center-side-ends of spiral discharge coil elements 102a, 102b, 102c, 102d may be connected to each other at the center of a discharge coil 102 at any angles. These discharge coils 101 and 102 have nonsymmetrical configurations with the centers thereof. Furthermore, as shown in FIGS. 18 and 19, a discharge coil 103 may have a bell-shaped configuration in three dimensions.

In the embodiments, the number of the spiral discharge coil elements is not limited to four, but may be two or more. Although the peripheral ends are grounded in the embodiments, the center ends may be grounded.

According to the plasma processing apparatus of the first and second aspects of the present invention, as apparent from the above description, the discharge coil is partially or wholly made to have a multiple spiral or helical configuration. With the above-mentioned arrangement, the impedance of the discharge coil can be reduced, and consequently matching can be achieved without specifically using the matching-use parallel coil of which impedance has a small imaginary number component. Therefore, an inductive coupled plasma processing apparatus capable of achieving a lowered power efficiency and a small temperature rise in the discharge coil-use matching circuit can be provided.

Furthermore, when the imaginary number component of the complex representation of the impedance of the discharge coil is made to be not greater than five times the characteristic impedance of the connection cable, matching can be achieved without using the matching-use parallel coil. Therefore, an inductive coupled plasma processing apparatus free from the lowering of power efficiency and temperature rise in the discharge coil-use matching circuit can be provided.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:

a vacuum vessel;

a substrate electrode;

a discharge coil which is partially or wholly made to have a multiple spiral configuration;

a high frequency power source; and a matching circuit that is connected to the discharge coil by way of a conductor wire and connected to the high frequency power source via a connection cable, and generates plasma inside the vacuum vessel by applying a high frequency voltage to the discharge coil so as to process a substrate disposed on the substrate electrode.

2. The plasma processing apparatus as claimed in claim 1, wherein the multiple spiral configuration of the discharge coil is symmetrical with a center of the discharge coil.

3. The plasma processing apparatus as claimed in claim 1, wherein the multiple spiral configuration of the discharge coil is nonsymmetrical with a center of the discharge coil.

4. The plasma processing apparatus as claimed in claim 1, wherein the discharge coil is so structured that an imaginary number component of a complex representation of an impedance thereof is not greater than five times a characteristic impedance of the connection cable.

5. The plasma processing apparatus as claimed in claim 1, wherein the discharge coil is so constructed that a distance between adjacent conductive wires constructing the discharge coil on a center side of the discharge coil is larger than that between adjacent conductive wires thereof on a peripheral side of the discharge coil.

6. The plasm processing apparatus as claimed in claim 1, wherein the discharge coil has a bell-shaped configuration in three dimensions.

7. A plasma processing apparatus comprising:

a vacuum vessel;

a substrate electrode;

a discharge coil which is partially or wholly made to have a multiple helical configuration;

a high frequency power source; and a matching circuit that is connected to the discharge coil by way of a conductor wire and connected to the high frequency power source via a connection cable, and generates plasma inside the vacuum vessel by applying a high frequency voltage to the discharge coil so as to process a substrate disposed on the substrate electrode.

8. The plasma processing apparatus as claimed in claim 7, wherein the discharge coil is so structured that an imaginary number component of a complex representation of an impedance thereof is not greater than five times a characteristic impedance of the connection cable.

\* \* \* \* \*